(12) United States Patent
Allegato et al.

(10) Patent No.: US 11,675,186 B2
(45) Date of Patent: Jun. 13, 2023

(54) HERMETICALLY SEALED MEMS MIRROR AND METHOD OF MANUFACTURE

(71) Applicant: STMicroelectronics S.r.l., Agrate Brianza (IT)

(72) Inventors: Giorgio Allegato, Monza (IT); Sonia Costantini, Missaglia Lecco (IT); Federico Vercesi, Milan (IT); Roberto Carminati, Piancogno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 804 days.

(21) Appl. No.: 16/591,854

(22) Filed: Oct. 3, 2019

(65) Prior Publication Data
US 2020/0033591 A1    Jan. 30, 2020

Related U.S. Application Data

(62) Division of application No. 15/245,805, filed on Aug. 24, 2016, now Pat. No. 10,473,920.

(51) Int. Cl.
*G02B 26/10* (2006.01)
*B81C 1/00* (2006.01)
*G02B 26/08* (2006.01)

(52) U.S. Cl.
CPC ........ *G02B 26/105* (2013.01); *B81C 1/00317* (2013.01); *B81C 1/00523* (2013.01); *G02B 26/0833* (2013.01); *B81B 2201/042* (2013.01); *B81C 2203/0109* (2013.01); *B81C 2203/019* (2013.01)

(58) Field of Classification Search
CPC ............ G02B 26/0105; G02B 26/0833; B81C 1/00317; B81C 2203/0109; B81B 2201/042; H01L 2924/1461
See application file for complete search history.

(56) References Cited

U.S. PATENT DOCUMENTS

| | | | |
|---|---|---|---|
| 7,204,737 B2 * | 4/2007 | Ding ................... | B81B 7/0038 445/24 |
| 7,238,999 B2 * | 7/2007 | LaFond ................. | G01P 15/125 438/5 |
| 7,348,193 B2 | 3/2008 | Ouyang | |
| 8,564,076 B1 * | 10/2013 | Huang .................. | B81B 7/0064 257/414 |
| 8,569,090 B2 * | 10/2013 | Taheri .................. | B81C 1/0023 438/456 |
| 8,691,607 B2 | 4/2014 | Ararao | |
| 8,810,027 B2 * | 8/2014 | Cheng .................. | B81C 1/0038 438/455 |

(Continued)

*Primary Examiner* — David A Zarneke
(74) *Attorney, Agent, or Firm* — Crowe & Dunlevy

(57) ABSTRACT

A method for making a micro-electro mechanical (MEMS) device includes forming a MEMS mirror stack on a handle layer, and applying a first bonding layer to the MEMS mirror stack. The method continues with disposing a substrate on the first bonding layer such that the MEMS mirror stack is mechanically anchored to the substrate and so as to seal against ingress of environmental contaminants, removing the handle layer, and applying a second bonding layer to the MEMS mirror stack. A cap layer is disposed on the second bonding layer such that the cap layer is mechanically anchored to the MEMS mirror stack and so as to seal against ingress of environmental contaminants.

11 Claims, 11 Drawing Sheets

(56) References Cited

U.S. PATENT DOCUMENTS

| | | |
|---|---|---|
| 9,140,898 B2 | 9/2015 | Ehmke et al. |
| 2002/0021860 A1 | 2/2002 | Ruan et al. |
| 2003/0227538 A1 | 12/2003 | Fujii et al. |
| 2004/0099739 A1 | 5/2004 | Kuo et al. |
| 2008/0042260 A1 | 2/2008 | Jeong et al. |
| 2011/0109951 A1 | 5/2011 | Goren et al. |
| 2012/0142144 A1 | 6/2012 | Taheri |
| 2014/0240837 A1 | 8/2014 | Nishimura |
| 2015/0049374 A1* | 2/2015 | Hofmann ............ B32B 38/0008 359/213.1 |
| 2016/0362296 A1* | 12/2016 | Lee ..................... H01L 23/5226 |

* cited by examiner

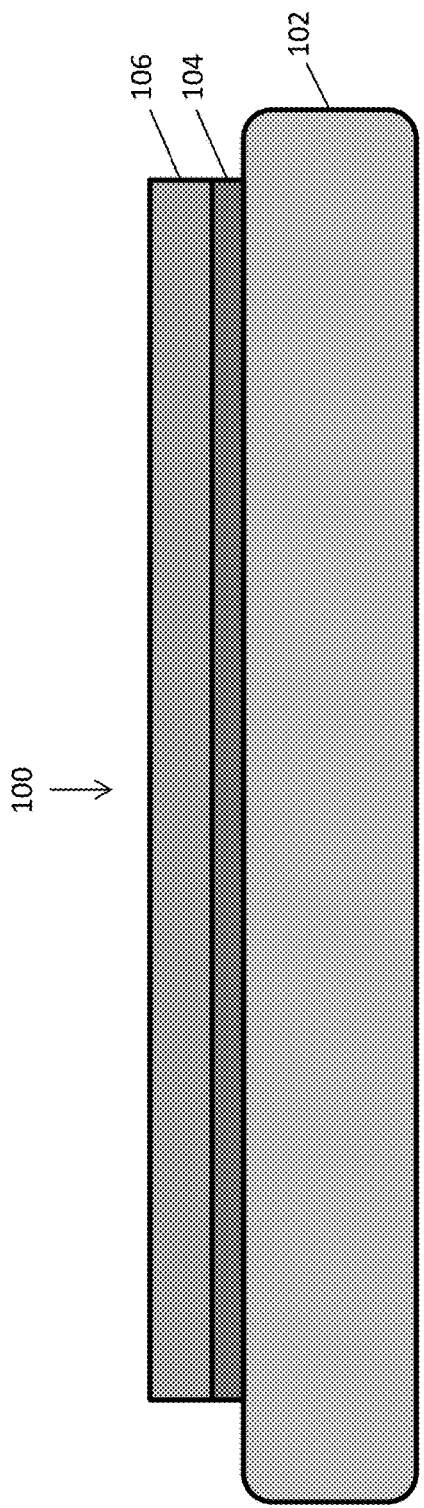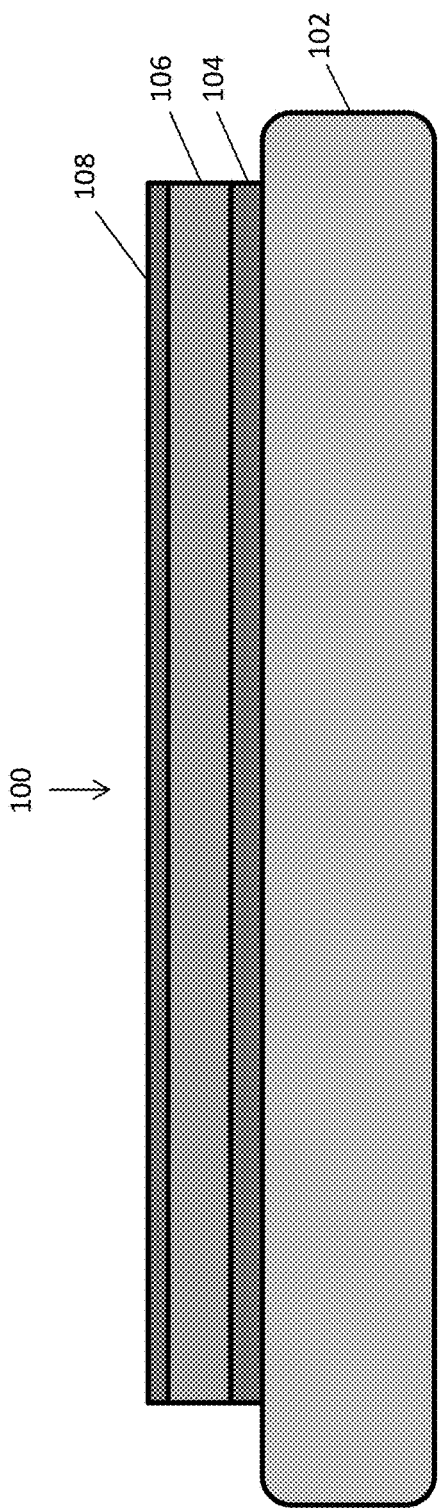

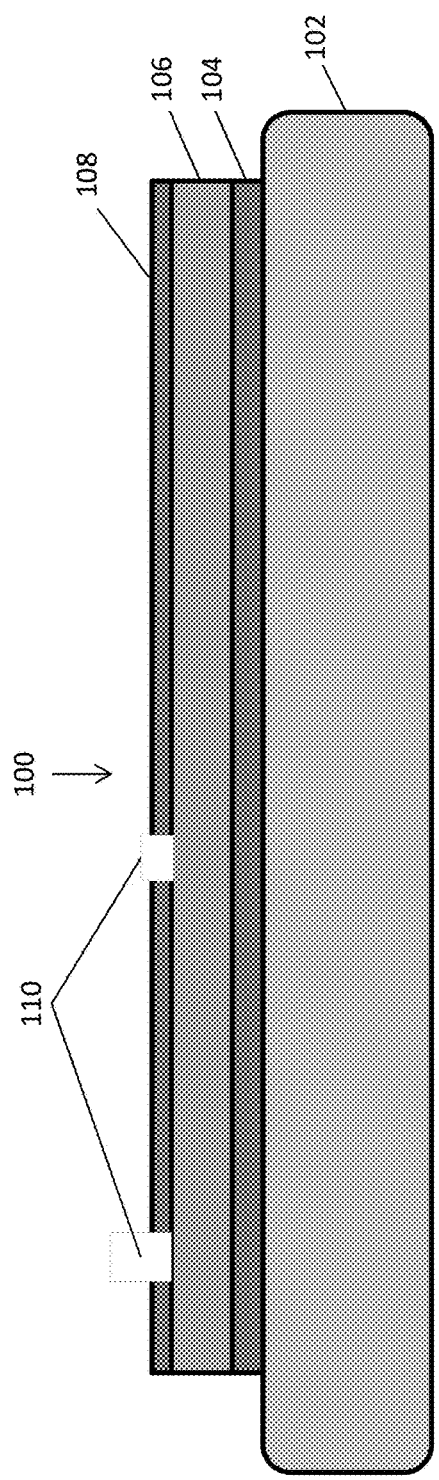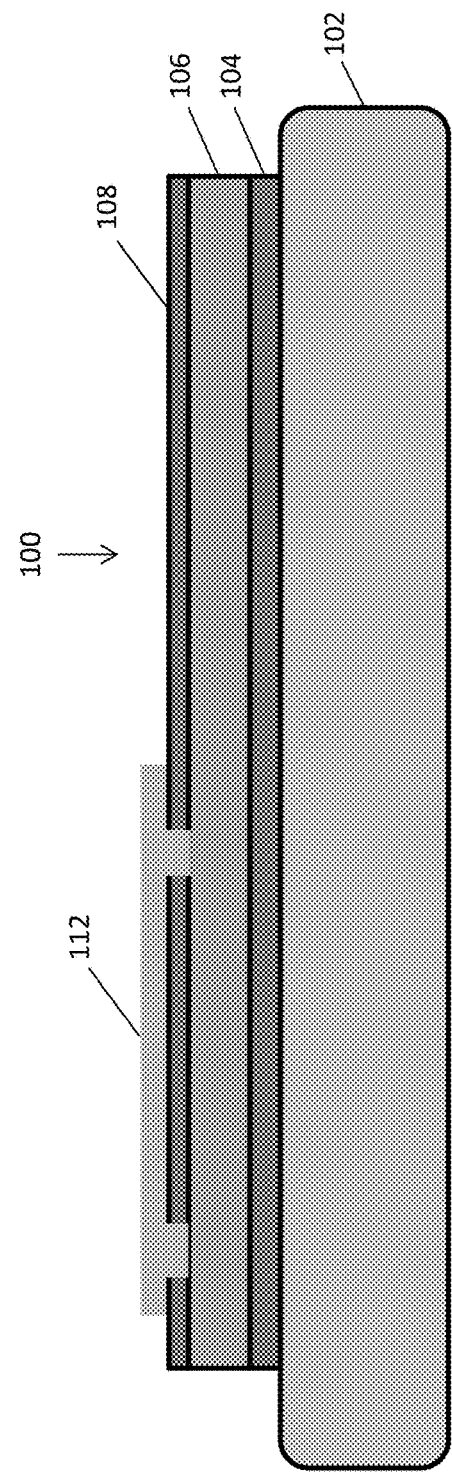

HERMETICALLY SEALED MEMS MIRROR AND METHOD OF MANUFACTURE

RELATED APPLICATION

This application is a divisional from U.S. patent application Ser. No. 15/245,805, filed on Aug. 24, 2016, the content of which is incorporated by reference in its entirety.

TECHNICAL FIELD

This disclosure relates to MEMS mirrors for scanning or deflecting light beams, and, in particular, to hermetically sealed MEMS mirror packages and methods of manufacturing same.

BACKGROUND

Certain devices such as small volume projectors, wafer defect scanners, laser printers, document scanners, projectors and the like often employ one or more collimated laser beams that scan across a flat surface in a straight line path. These devices employ tilting mirrors to deflect the beam to perform the scanning. These tilting mirrors may be, or may include, Micro Electro Mechanical Systems ("MEMS") devices.

A typical MEMS mirror includes a static portion, called a stator, and a rotating portion, called a rotor. The rotor rotates with respect to the stator, and serves as or carries the surface that performs the mirroring operation. Where electrostatic forces are used to cause the rotation of the rotor, drawbacks result from operation in ambient air pressure. It is thus desirable for the rotor to rotate in a low pressure or vacuum environment. Unfortunately, the designs of conventional MEMS mirror packages with an internal vacuum environment are complex, and the methods of manufacture even more complex, rendering the cost to produce such designs prohibitive for use in many scenarios.

Therefore, new designs of MEMS mirror packages with an internal vacuum environment, and new ways of manufacturing same, are desirable.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a micro-electro mechanical (MEMS) device including a substrate and a MEMS mirror stack on the substrate. A first bonding layer seals against ingress of environmental contaminants and mechanically anchors the MEMS mirror stack to the substrate. A cap layer is on the MEMS mirror stack, and a second boding layer seals against ingress of environmental contaminants and mechanically anchors the cap layer to the MEMS mirror stack.

The MEMS mirror stack may include a support layer in contact with the first bonding layer, a stator mechanically joined to the support layer, and a rotor associated with the stator and configured to rotate with respect hereto. The support layer may have an interconnection layer formed therein.

The substrate may have a first recess formed therein, the cap layer may have a second recess formed therein, and the first and second recesses may form upper and lower chambers through which at least a portion of the rotor rotates when rotating with respect to the stator. The air pressure within the upper and lower chambers may be within a threshold of vacuum. The stator and rotor may be collocated such that the rotor rotates in a plane occupied by the stator. The rotor may rotate in a plane not occupied by the stator.

The cap layer may be glass, and may have a width less than a width of the MEMS mirror stack in at least one direction.

The MEMS mirror stack may have at least one pad on a surface thereof left exposed by the cap layer having the lesser width than the MEMS mirror stack.

The substrate may have a width less than a width of the MEMS mirror stack in at least one direction. The MEMS mirror stack may have at least one pad on a surface thereof left exposed by the substrate having the lesser width than the MEMS mirror stack.

A method aspect is directed to a method of making a micro-electro mechanical (MEMS) device. The method includes forming a MEMS mirror stack on a handle layer, applying a first bonding layer to the MEMS mirror stack, and disposing a substrate on the first bonding layer such that the MEMS mirror stack is mechanically anchored to the substrate and so as to seal against ingress of environmental contaminants. The method also includes removing the handle layer, applying a second bonding layer to the MEMS mirror stack, and disposing a cap layer on the second bonding layer such that the cap layer is mechanically anchored to the MEMS mirror stack and so as to seal against ingress of environmental contaminants.

Forming the MEMS mirror stack on the handle layer may include disposing a silicon layer on the handle layer, disposing a first insulating layer on the silicon layer, etching portions of the first insulating layer, depositing a first conductive layer on the first insulating layer and into the etched portions thereof, and depositing a second insulating layer on the first conductive layer.

Forming the MEMS mirror stack on the handle layer may include removing at least one portion of the second insulating layer, first conductive layer, and first insulating layer so as to form a lower chamber.

Applying the first bonding layer to the MEMS mirror stack may include applying the first bonding layer to the second insulating layer. The silicon layer may be processed so as to form a stator, and a rotor may be associated with the stator and configuring the rotor to rotate with respect to the stator.

At least one portion of the second insulating layer may be removed so as to expose at least one portion of the first conductive layer, and a conductive pad may be formed on the at least one exposed portion of the first conductive layer. A second conductive layer may be deposited on the silicon layer.

The cap layer may be disposed on the second bonding layer in an environment having air pressure substantially at a vacuum.

BRIEF DESCRIPTION OF THE DRAWINGS

FIGS. 6-15 are consecutive cross sectional views of the movable MEMS mirror of FIG. 3 as it progresses through a series of manufacturing steps, in accordance with this disclosure.

DETAILED DESCRIPTION

Figure 1:
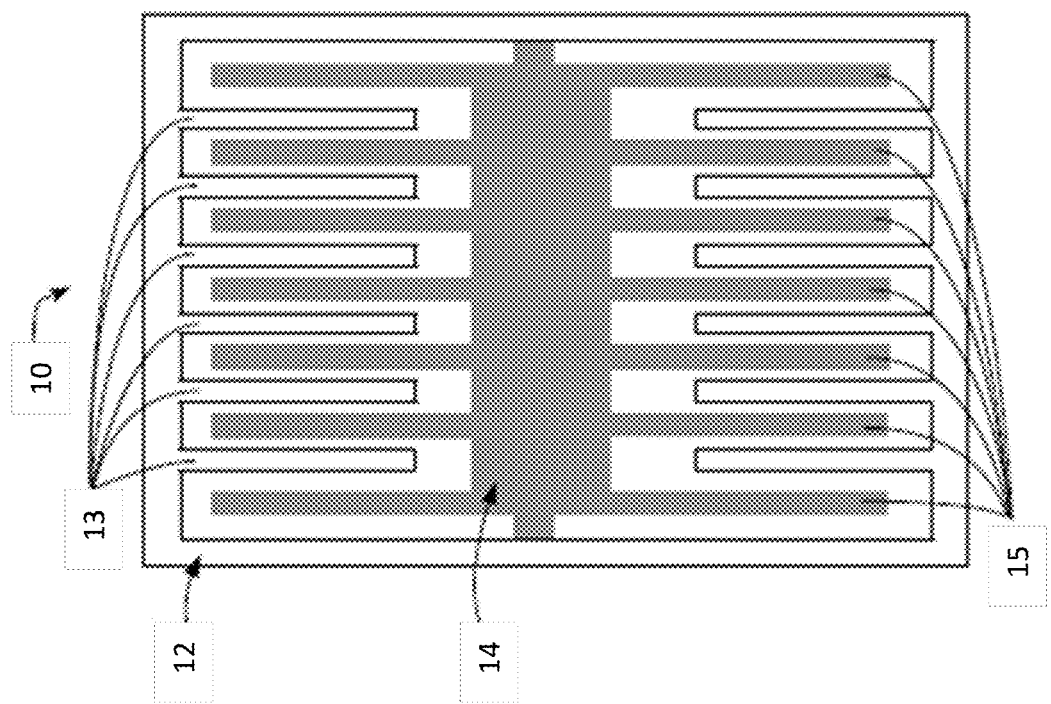
FIG. 1 is a top plan view of a movable MEMS mirror.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout, and reference numbers separated by century, as well as reference numbers with prime notation, may indicate similar elements in other applications or embodiments.

First, a sample configuration of a movable MEMS mirror 10 will now be described with reference to FIG. 1. Thereafter, specific MEMS mirror 10 designs and methods of manufacture will be described.

The movable MEMS mirror 10 may be used in devices such as wafer defect scanners, laser printers, document scanners, projectors, and pico-projectors. The movable MEMS mirror 10 includes a stator 12 having inwardly projecting fingers 13. A rotor 14 is positioned within the stator 12 and has outwardly projecting fingers 15 that interleave with the inwardly projecting fingers 13 of the stator 12. The rotor 14 oscillates about its axis, oscillating its mirror surface with respect to the stator 12.

Either the stator 12 or the rotor 14 is supplied with a periodic signal, such as a square wave, while the other is supplied with a reference voltage. In the case where the periodic signal has an oscillating square voltage, for example, electrostatic forces cause the rotor 14 to oscillate about its axis relative to the stator 12. In the case where the periodic signal has an oscillating square current, for example, magnetic forces cause the rotor 14 to oscillate about its axis relative to the stator 12. Indeed, the movable MEMS mirror 10 may be driven according to any suitable way known to those of skill in the art.

Figure 2:
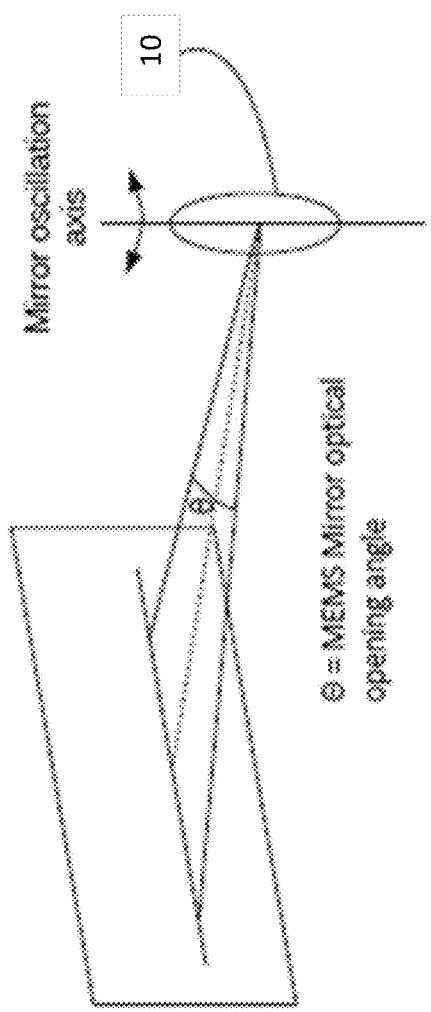
FIG. 2 is a perspective view showing operation of a movable MEMS mirror performing a scanning operation.

For use in scanning a light beam across a surface, the movable MEMS mirror 10 is driven so that it oscillates at its resonant frequency between two set or controllable oscillation limits. Shown in FIG. 2 is the movable MEMS mirror 10 scanning a light beam across a projection screen between two set rotation limits that define an "opening angle" θ of the movable MEMS mirror 10.

Figure 3:
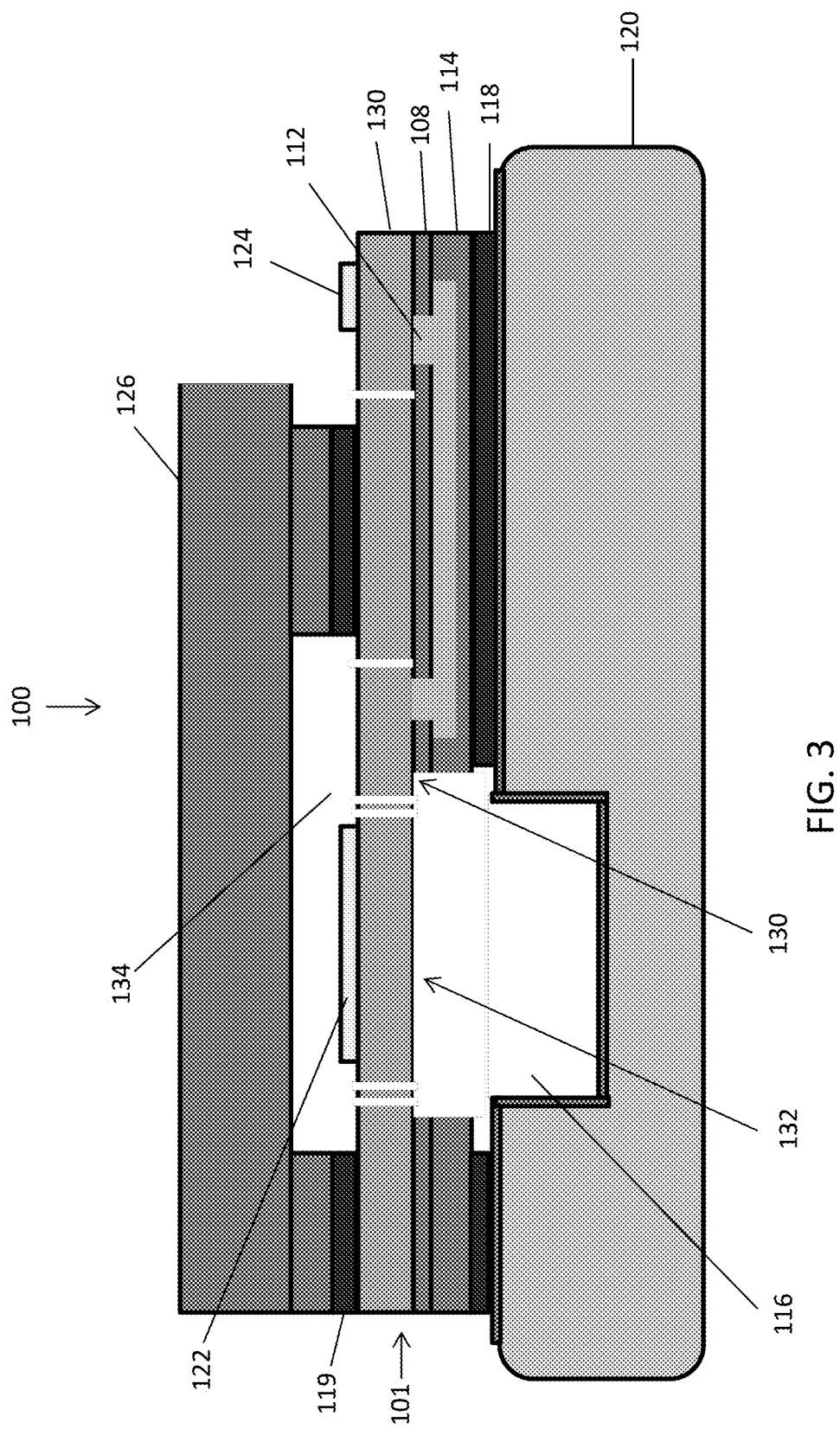
FIG. 3 is a cross sectional view of a first design of movable MEMS mirror, in accordance with this disclosure.

With reference to FIG. 3, a MEMS mirror package 100 having an internal vacuum is now described. The MEMS mirror package 100 includes a substrate 120, and a first bonding layer 118 on the substrate. A support layer 114 that has interconnections 112 formed therein is on the first bonding layer 118. The interconnections 112 pass through an interconnection layer 108 on the support layer 114. A stator 130 is on the interconnection layer 108. A rotor 132 is associated with the stator 130 (here, the association being that the rotor 132 is disposed within openings in the stator 130). The rotor 132 carries a mirror 122, and a terminal 124 is exposed on a surface of the rotor 132.

The substrate 120 may be any suitable substrate, such as silicon. The first bonding layer 118 may be glass frit, polymeric bonding, or oxide. The support layer 114 and interconnection layer 108 may be any suitable dielectric. The interconnections 112 and terminal 124 may be copper, other metals, doped polysilicon, or other suitable materials. The stator 130 and rotor 132 are formed from suitable conductive materials within a supporting silicon layer.

The support layer 114, interconnection layer 108, stator 130, and rotor 132 can be collectively referred to as a MEMS mirror stack 101 that is anchored to the substrate 120 by the first bonding layer 118. The first bonding layer 118 not only mechanically anchors the MEMS mirror stack 101 to the substrate, but serves to seal against ingress of environmental contaminants.

A recess 116 is formed within the substrate 120 provides clearance and space for the mirror 122 to rotate through as the rotor 132 rotates. Since the MEMS mirror stack 101 is sealed against the substrate 120 by the first bonding layer 118 and an environmental sealing is provided thereby, the recess 116 and MEMS mirror stack 101 define a lower chamber 116.

A second bonding layer 119 is on the MEMS mirror stack 101, and serves to mechanically anchor a cap layer 126 thereto. The second bonding layer 119 also provides for environmental sealing. The cap layer 126, such as glass, is shaped so as to have a recess 134 therein providing clearance and space for the mirror 122 to rotate through as the rotor 132 rotates. Since the cap layer is 126 is sealed against the MEMS mirror stack 101 by the first bonding layer 118 and an environmental sealing is provided thereby, the recess 134 and MEMS mirror stack 101 define an upper chamber 134. Air pressure within the upper and lower chambers 134, 116 is within a threshold of vacuum.

Figure 4:
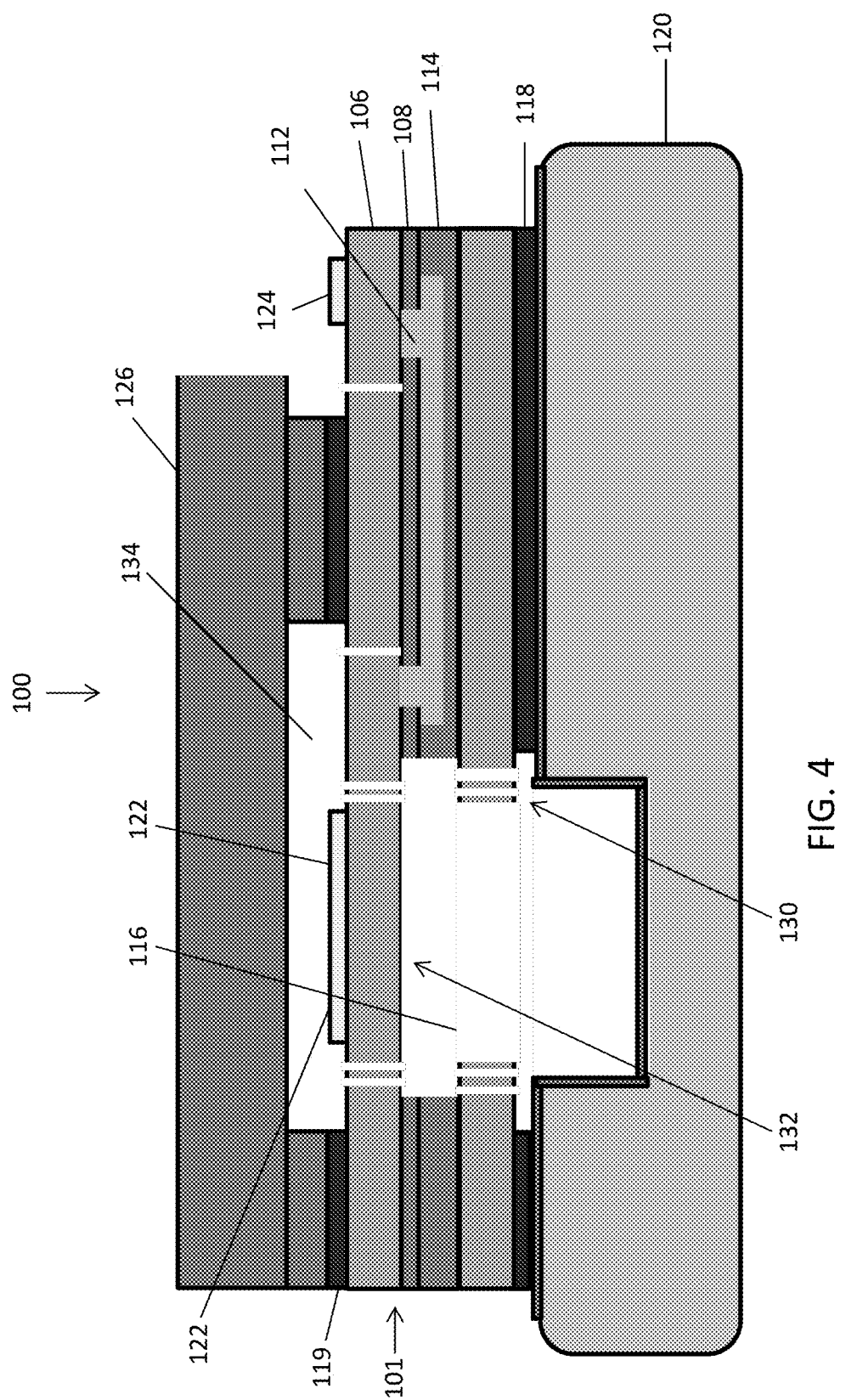
FIG. 4 is a cross sectional view of a second design of movable MEMS mirror, in accordance with this disclosure.

Although the application depicted in FIG. 3 shows the stator 130 and rotor 132 being collocated such that the rotor 132 rotates in a plane occupied by the stator 130, other designs are possible. For example, as shown in the design of FIG. 4, the stator 130 and rotor 132 may be separate spaced apart layers, with the support layer 114 in between. In this setup, the rotor 132 rotates in a plane not occupied by the stator 130, although the fingers of the rotor 132 pass through the stator 130 as the rotor 132 rotates.

Figure 5:
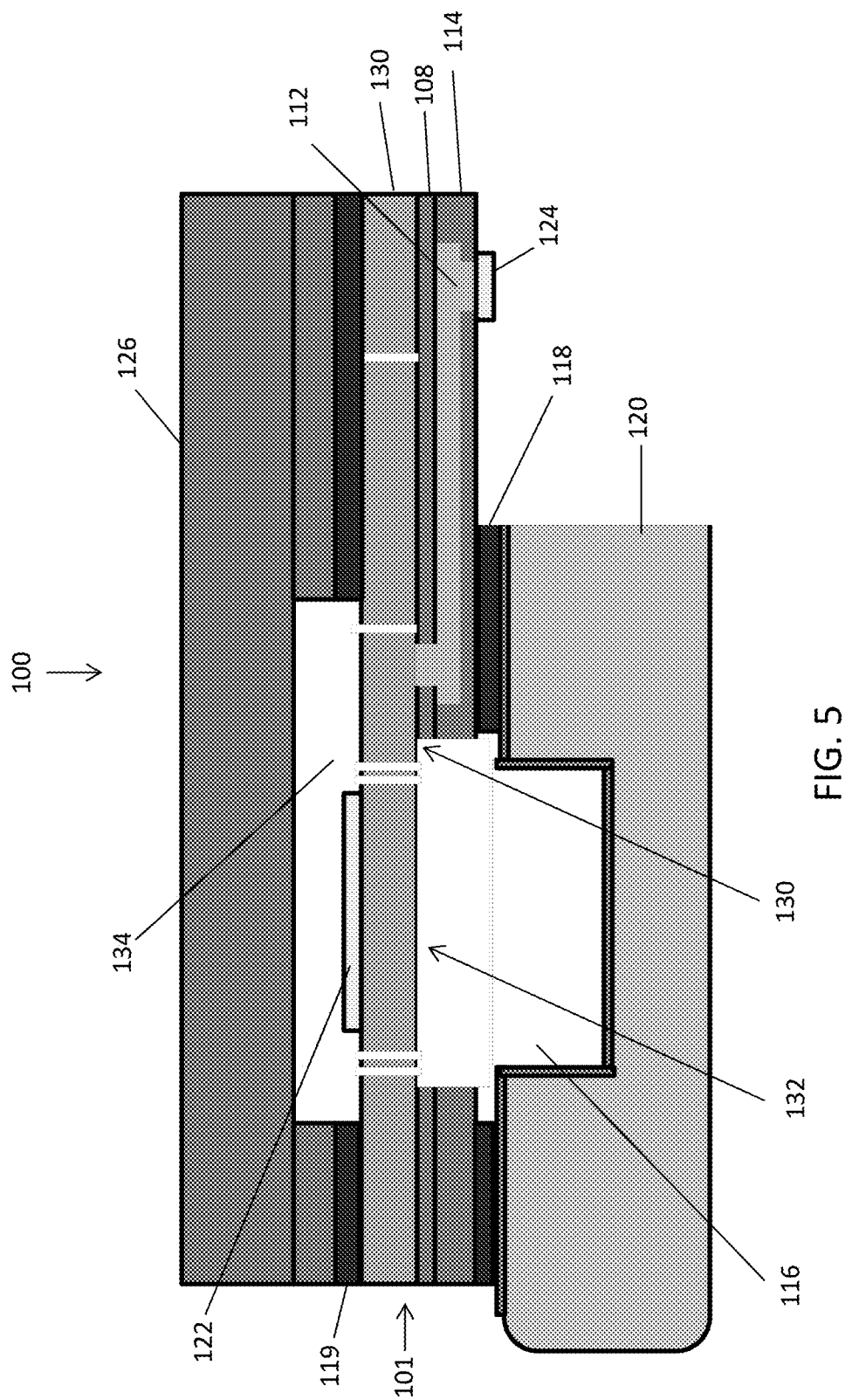
FIG. 5 is a cross sectional view of a third design of movable MEMS mirror, in accordance with this disclosure.

As shown, the cap layer 126 has a width less than a width of the MEMS mirror stack 101 in at least one direction so as to expose the terminal 124 on an upper side of the MEMS mirror stack 101. However, as shown in FIG. 5, in some applications, the substrate 120 may have a width less than that of the MEMS mirror stack 101 in at least one direction so as to expose the terminal 124 on the bottom side of the MEMS mirror stack 101.

Manufacture of the MEMS mirror package 100 will now be described with reference to FIGS. 6-15. Referring initially to FIG. 6, the starting building block of the MEMS mirror package 100 is a handle layer 102, with an insulator layer 104 formed thereon. Thereafter, a layer of silicon 106 is deposited on the insulator layer 104. Then, another insulator layer 108 is deposited on the layer of silicon 106, thereby creating a silicon on insulator (SOI) structure, as shown in FIG. 7.

Figure 10:
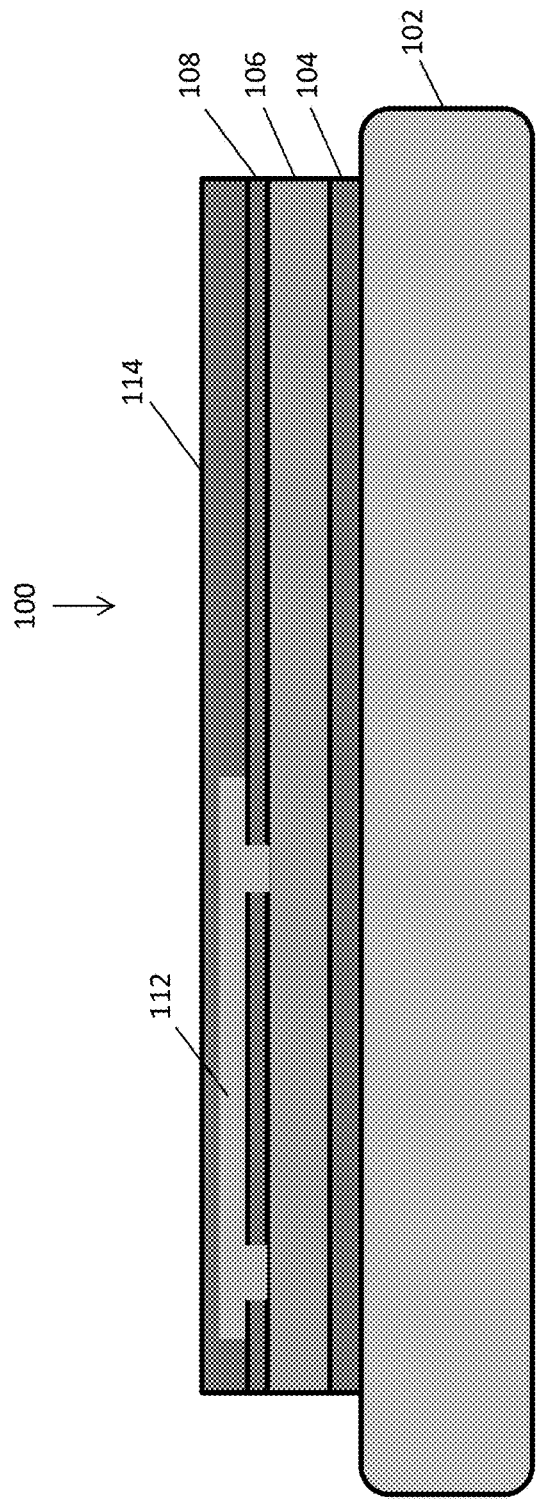
Figure 11:
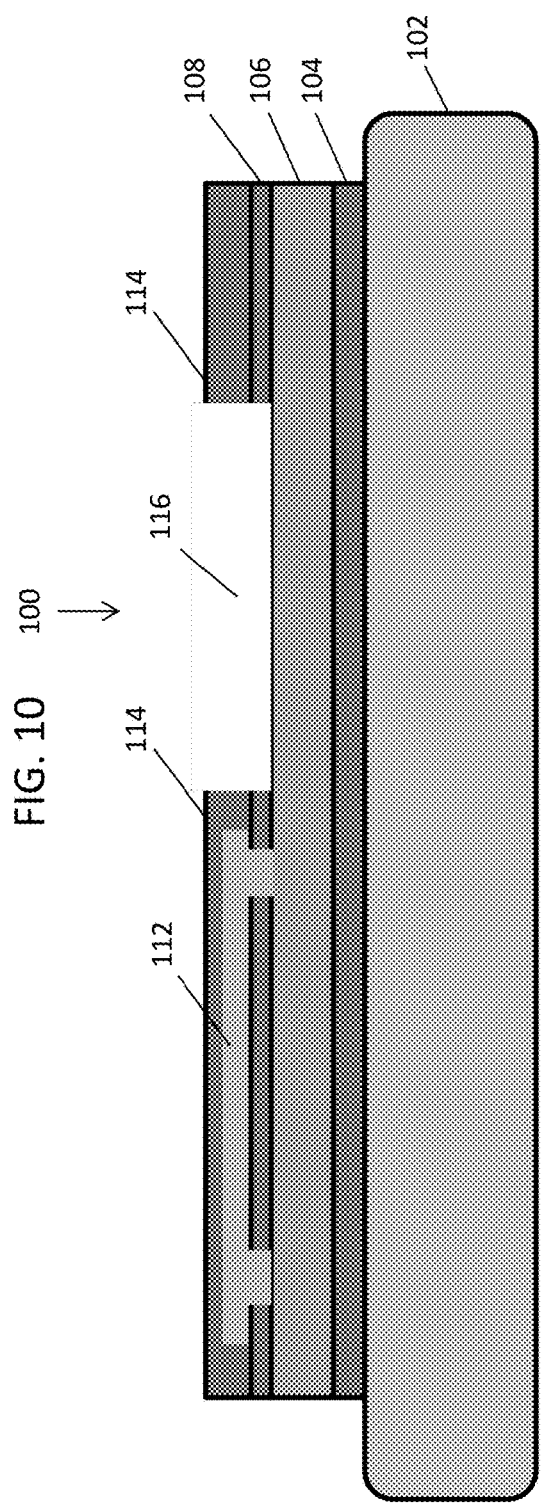

Portions 110 of the insulator layer 108 are then etched, as shown in FIG. 8, and a conductive layer to act as interconnections 112 is deposited on the insulating layer 108 and into the etched portions 110, as shown in FIG. 9. Subsequently, an insulating layer 114 is deposited on the insulating layer 108 and the exposed interconnections 112, as shown in FIG. 10. Next, a portion 116 of the insulating layers 114 and 108 are removed so as to form a lower chamber, as shown in FIG. 11.

Figure 12:
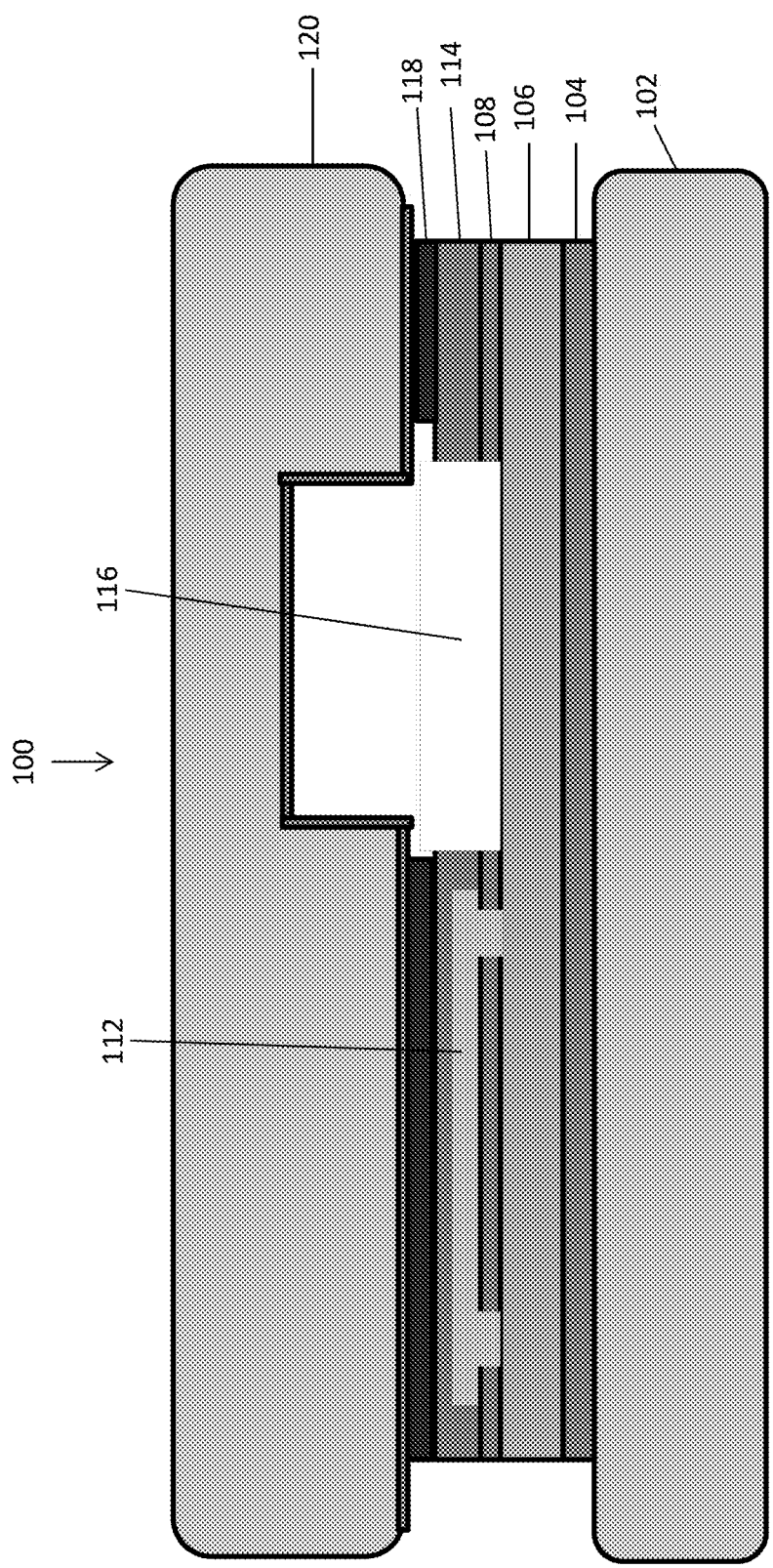
Figure 13:
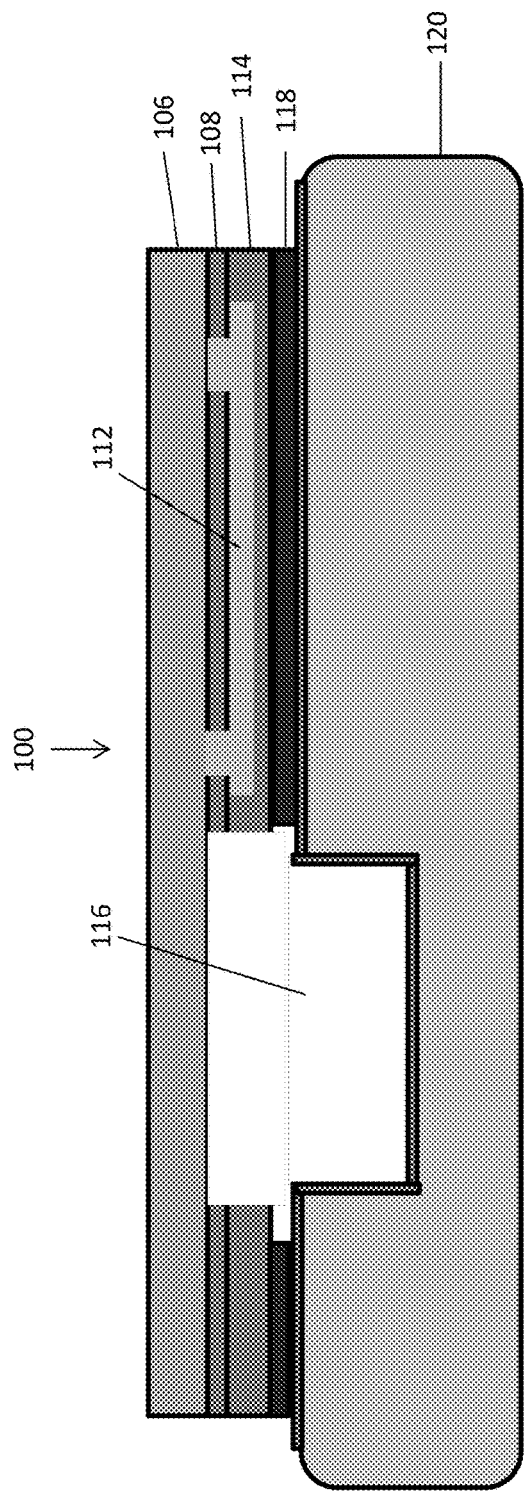

Next, a bonding layer 118 is disposed on the insulating layer 114, and a substrate 120 is placed on the bonding layer 118, as shown in FIG. 12. The MEMS mirror package 100 at this point is flipped over, and the handle 102 is removed, yielding the structure shown in FIG. 13. In some cases, the insulating layer 104 is removed at the same time as the handle 102, and in some cases it is removed after the handle 102 is removed.

Figure 14:
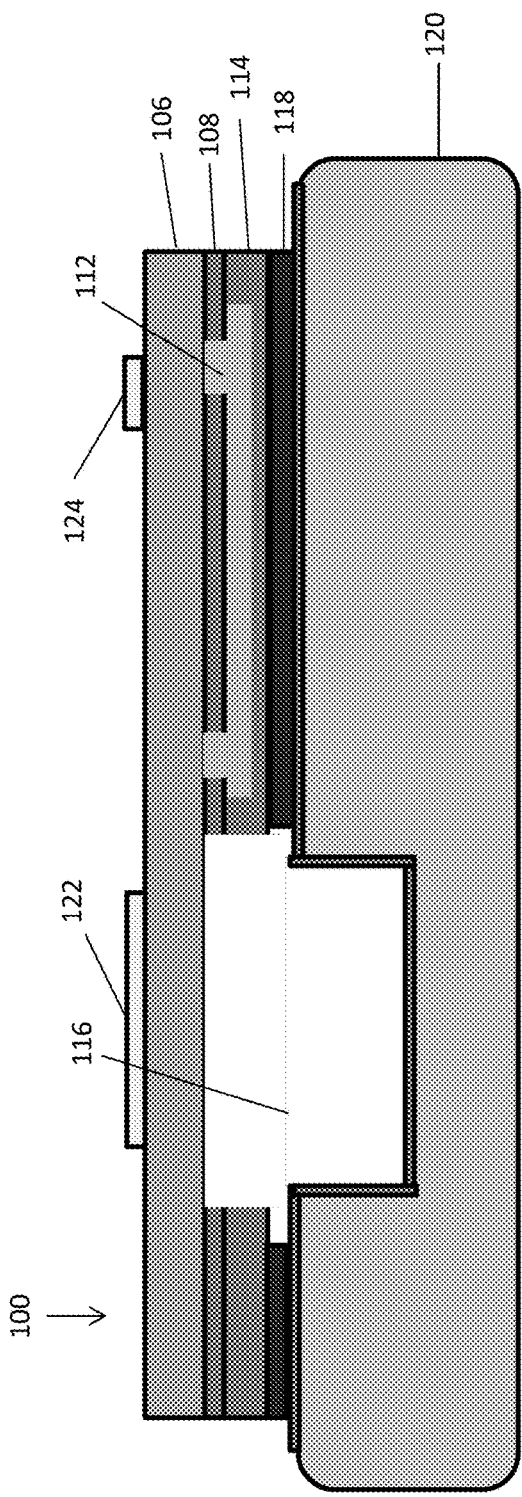
Figure 15:
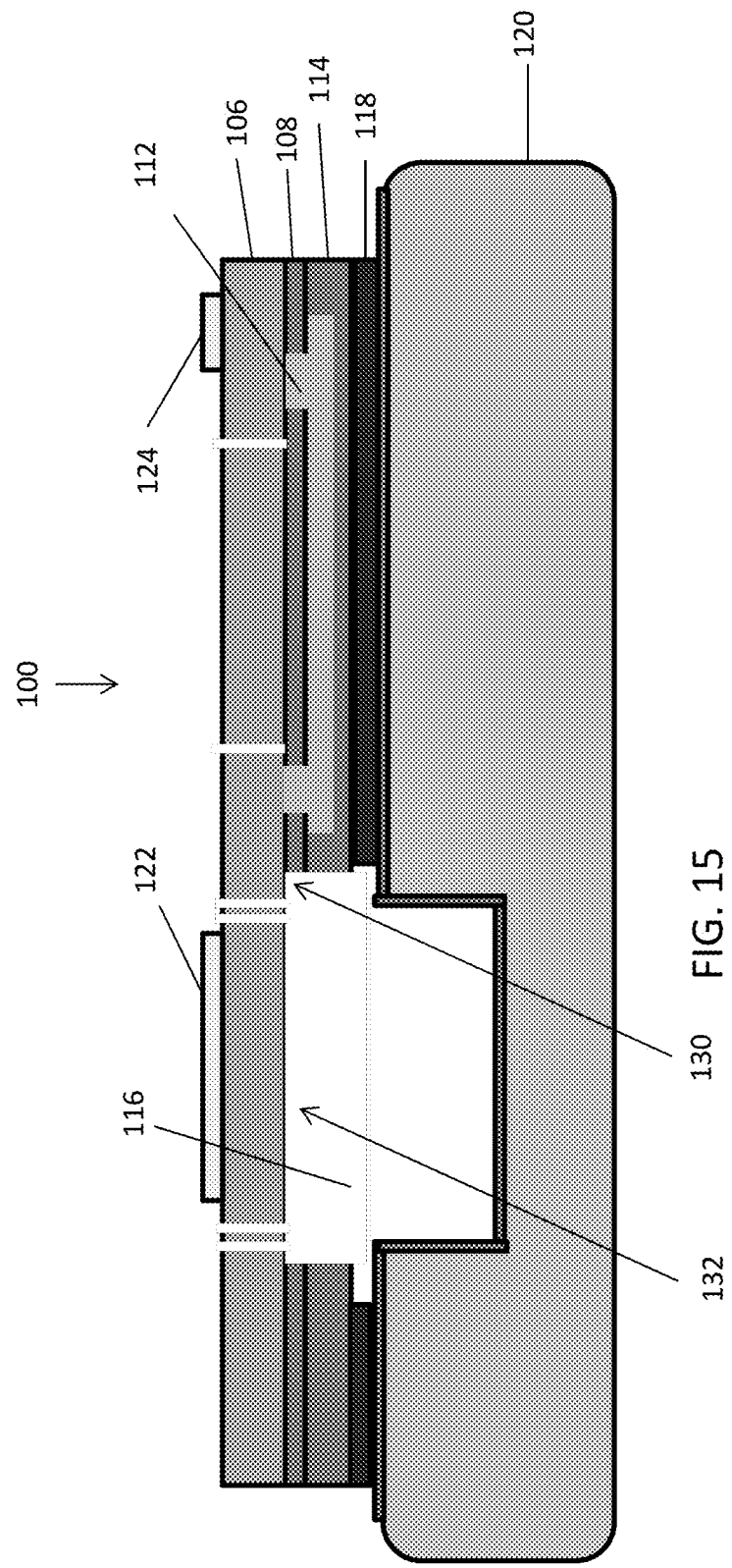

The mirror 122 itself is then deposited on the silicon layer 106, as is the contact pad 124, as shown in FIG. 14. Then, structures for the rotor 132 and stator 130 are etched, as shown in FIG. 15, and thereafter the rotor 132 and stator 130 are either formed or placed. Then, a bonding layer 119 is deposited on the stator 130, and the cap 126 is placed. This produces the MEMS mirror package 100 shown in FIG. 3.

The placement of the cap 126, as well as attachment of the substrate 120, are performed in an environment having an air pressure that is substantially a vacuum, thereby producing the upper chamber 134 and lower chamber 116 having an internal vacuum or substantial vacuum.

The MEMS mirror packages 100 shown in FIGS. 4-5 are formed by changing the layout of the interconnections 112, and by choosing the size of the cap 126 selectively, or by selectively removing appropriate portions of the substrate 120.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of making a micro-electro mechanical (MEMS) device, comprising:
   forming a MEMS mirror stack on a handle layer, comprising:
      disposing a silicon layer on the handle layer;
      disposing a first insulating layer on the silicon layer;
      etching portions of the first insulating layer;
      depositing a first conductive layer on the first insulating layer and into the etched portions thereof; and
      depositing a second insulating layer on the first conductive layer;
   applying a first bonding layer to the MEMS mirror stack;
   disposing a substrate on the first bonding layer such that the MEMS mirror stack is mechanically anchored to the substrate and so as to seal against ingress of environmental contaminants;
   removing the handle layer;
   applying a second bonding layer to the MEMS mirror stack; and
   disposing a cap layer on the second bonding layer such that the cap layer is mechanically anchored to the MEMS mirror stack and so as to seal against ingress of environmental contaminants.

2. The method of claim 1, wherein forming the MEMS mirror stack on the handle layer further comprises removing at least one portion of the second insulating layer, the first conductive layer, and the first insulating layer so as to form a lower chamber.

3. The method of claim 2, wherein applying the first bonding layer to the MEMS mirror stack comprises applying the first bonding layer to the second insulating layer.

4. The method of claim 3, further comprising processing the silicon layer so as to form a stator, and associating a rotor with the stator and configuring the rotor to rotate with respect to the stator.

5. The method of claim 2, further comprising removing at least one portion of the second insulating layer so as to expose at least one portion of the first conductive layer, and forming a conductive pad on the at least one exposed portion of the first conductive layer.

6. The method of claim 5, wherein the MEMS mirror stack is formed to have a width greater than a width of the substrate in at least one direction; and wherein the conductive pad extends away from the MEMS mirror stack opposite the cap layer and is exposed by the MEMS mirror stack having the width greater than the width of the substrate in the at least one direction.

7. The method of claim 1, further comprising depositing a second conductive layer on the silicon layer.

8. The method of claim 1, wherein the cap layer is disposed on the second bonding layer in an environment having pressure substantially at a vacuum.

9. A method of making a micro-electro mechanical (MEMS) device, comprising:
   forming a MEMS mirror stack on a handle layer by:
      disposing a silicon layer on the handle layer;
      disposing a first insulating layer on the silicon layer;
      etching portions of the first insulating layer;
      depositing a first conductive layer on the first insulating layer and into the etched portions thereof; and
      depositing a second insulating layer on the first conductive layer;
   applying a first bonding layer to the MEMS mirror stack; and
   disposing a substrate on the first bonding layer such that the MEMS mirror stack is mechanically anchored to the substrate and so as to seal against ingress of environmental contaminants.

10. The method of claim 9, wherein forming the MEMS mirror stack on the handle layer further comprises removing at least one portion of the second insulating layer, first conductive layer, and first insulating layer so as to form a lower chamber.

11. The method of claim 10, wherein applying the first bonding layer to the MEMS mirror stack comprises applying the first bonding layer to the second insulating layer.

* * * * *